US007927895B1

(12) United States Patent
Lavoie et al.

(10) Patent No.: US 7,927,895 B1
(45) Date of Patent: Apr. 19, 2011

(54) VARYING CAPACITANCE VOLTAGE CONTRAST STRUCTURES TO DETERMINE DEFECT RESISTANCE

(75) Inventors: Christian Lavoie, Yorktown Heights, NY (US); Conal E. Murray, Yorktown Heights, NY (US); Oliver D. Patterson, Hopewell Junction, NY (US); Robert L. Wisnieff, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 10 days.

(21) Appl. No.: 12/574,118

(22) Filed: Oct. 6, 2009

(51) Int. Cl.
*H01L 21/00* (2006.01)
(52) U.S. Cl. ............................................ 438/18; 438/14
(58) Field of Classification Search ............... 438/14–18
See application file for complete search history.

(56) References Cited

U.S. PATENT DOCUMENTS

| 5,189,306 | A  | * | 2/1993  | Frei ........................... 250/492.2 |
|-----------|----|---|---------|-------------------------------------------|
| 6,297,644 | B1 |   | 10/2001 | Jarvis et al.                             |
| 6,509,197 | B1 |   | 1/2003  | Satya et al.                              |
| 6,861,666 | B1 |   | 3/2005  | Weiner et al.                             |
| 6,921,672 | B2 |   | 7/2005  | Satya et al.                              |
| 7,026,175 | B2 |   | 4/2006  | Li et al.                                 |
| 2006/0192904 | A1 |   | 8/2006 | Almogy et al.                             |
| 2008/0032429 | A1 | * | 2/2008 | Chen et al. ...................... 438/14 |
| 2009/0057644 | A1 | * | 3/2009 | Shin et al. ......................... 257/4 |
| 2009/0096461 | A1 |   | 4/2009 | Ahsan et al.                              |
| 2010/0279436 | A1 | * | 11/2010 | Fu et al. .......................... 438/14 |

OTHER PUBLICATIONS

J.C. Lee, C.H. Chen, D. Su, J.H. Chuang, "Investigation of Sensitivity Improvement on Passive Voltage Contrast for Defect Isolation", Microelectronics Reliability, vol. 42, No. 9-11, pp. 1707-1710, 2002.

M. Matsui, T. Odaka, H. Nagaishi, K. Sakurai, "Quantitative Measurement of Voltage contrast in SEM Images for In-Line Resistance Inspection of Wafers Manufactured for SRAM", Proceedings of the SPIE-The International Society for Optical Engineering, vol. 7272, pp. 72721D (8 pages), 2009.
M. Matsui, Y. Anan, T. Odaka, H. Nagaishi, K. Sakurai, "In Line Inspection Resistance Mapping Using Quantitative Measurement of Voltage Contrast in SEM Images", Proceedings of the SPIE-The International Society for Optical Engineering, vol. 6922, pp. 692218-1-692218-8, 2008.
M. Matsui, Z. Cheng, M. Nozoe, K. Torli, "Detecting Defects in Cu Metallization Structures by Electron-Beam Wafer Inspection", Journal of the Eletrochemical Society, vol. 151, No. 6, pp. G440-2, 2004.
O.D. Patterson, H. Wildman, D. Gal, K. Wu, "Detection of Resistive Shorts and Opens Using Voltage Contrast Inspection", Micro, vol. 24, No. 5, pp. 67-68, 2006.
T. Sakai, N. Oda, T. Yokoyama, H. Kikuchi, H. Kitajima, "Defect Isolation and Characterization in Contrast Array/Chain Structures by Using Voltage Contrast Effect", Conference Proceedings of IEEE International Symposium on Semiconductor Manufacturing Conference, Santa Clara, CA, Oct. 11-13, 1999., pp. 195-198.

* cited by examiner

*Primary Examiner* — Richard A. Booth
(74) *Attorney, Agent, or Firm* — Cantor Colburn LLP; Ian MacKinnon

(57) ABSTRACT

A method for determining resistances of defects in a test structure, comprising: forming a first layer of the test structure having elements under test; generating a first e-beam image of the first layer, the first e-beam image graphically identifying defects detected at the first layer, each defect at the first layer having a corresponding grey scale level; adding capacitance to the structure by forming a metal layer of the structure; generating a second e-beam image of the metal layer, the second e-beam image graphically identifying defects detected at the metal layer, each defect at the metal layer having a corresponding grey scale level; generating a pattern of grey scale levels for each defect based on the corresponding grey scale level of each defect at each layer of the test structure; and determining a resistive range of each defect based on the pattern of grey scale levels generated for each defect.

16 Claims, 7 Drawing Sheets

MASTER TABLE

| | 1M - 10 Mohm | 10 - 50 Mohm | 50 - 200 Mohm | 200 - 500 Mohm | 500 - 1000 Mohm |
|---|---|---|---|---|---|
| CONTACT | ▨ | ■ | ■ | ■ | ■ |
| METAL 1 | □ | ▨ | ■ | ■ | ■ |
| METAL 2 | □ | □ | ▨ | ■ | ■ |
| METAL 3 | □ | □ | □ | ▨ | ■ |
| METAL 4 | □ | □ | □ | □ | ▨ |

CANDIDATE DEFECT

| CONTACT | ■ |
| METAL 1 | ▨ |
| METAL 2 | □ |
| METAL 3 | □ |
| METAL 4 | □ |

VARYING CAPACITANCE VOLTAGE CONTRAST STRUCTURES TO DETERMINE DEFECT RESISTANCE

BACKGROUND

In-line voltage contrast (VC) inspection is a powerful technique for detecting and isolating yield limiting defects in the semiconductor fabricating industry. In-line VC inspection includes scanning the wafer surface in which test structures exist with a scanning electron microscope (SEM). As the inspection proceeds, the SEM induces a charge on all electrically floating elements whereas any grounded elements remain at zero potential. This potential difference is visible to the SEM. In particular, for electron landing energies less than the second crossover of the secondary electron yield curve (approximately 2.5 keV for tungsten (W) and copper (Cu)), grounded elements appear bright whereas floating elements appear dark.

Test structures exploiting this phenomenon can be created for many yield limiting defects including metal, gate and active region shorts and opens, and via and contact opens. For example, FIGS. 1A-B, show a short (FIG. 1B) indicated by a normally floating (dark) element becoming bright, and an open (FIG. 1A) indicated when a normally bright element becomes dark. FIG. 1C shows a gate level open indicated when a normally bright element becomes dark. As shown, even if the defect causing the electrical failure is buried or extremely small, its existence is indicated by a change in the VC signal of the entire element. In addition, the exact location of an open is indicated by a change in the VC signal of the structure after the break.

E-beam inspection is a popular technique for in-line detection of yield limiting defects. One limitation is sensitivity to resistive opens and shorts. Under e-beam inspection, resistances less than about 10 Mohms look like shorts and resistances a little greater than this value look like opens. There is a resistance range where the voltage contrast appears gray, but this is relatively small.

The 10 Mohms value is used because the latest e-beam inspection tools utilize electron beam currents of up to 500 nA. The net induced current flow at the wafer surface is a fraction of this current and depends on the beam conditions. Assuming it is 30%, then the voltage induced on an electrical node with a leakage path to ground of 10 Mohms is 1.5V. Theoretically, the beam current could be changed and the induced voltage would change proportionally. In practice though, only a single voltage is used per wafer scan.

Quantifying the resistance of resistive opens is quite difficult. The ability to quantify the resistance of opens would be helpful for characterization of processes.

SUMMARY

According to one embodiment of the present invention, a method for determining resistances of defective resistive opens or shorts in a test structure is provided. The method includes: forming a first layer of the test structure having one or more elements under test; generating a first e-beam image of the first layer, the first e-beam image graphically identifying defects detected at the first layer, each defect detected at the first layer having a corresponding grey scale level; adding capacitance to the test structure by forming a first metal layer of the test structure; generating a second e-beam image of the first metal layer, the second e-beam image graphically identifying defects detected at the first metal layer, each defect detected at the first metal layer having a corresponding grey scale level; generating a pattern of grey scale levels for each defect based on the corresponding grey scale level of each defect detected at each layer of the test structure; and determining a resistive range of each defect based on the pattern of grey scale levels generated for each defect.

According to another aspect of the invention, a method for determining resistances of defective resistive opens or shorts in a test structure is provided. The method includes: forming a first layer of the test structure having one or more elements under test; generating a first e-beam image of the first layer, the first e-beam image graphically identifying defects detected at the first layer, each defect detected at the first layer having a corresponding grey scale level; adding capacitance to the test structure by forming a first metal layer of the test structure; generating a second e-beam image of the first metal layer, the second e-beam image graphically identifying defects detected at the first metal layer, each defect detected at the first metal layer having a corresponding grey scale level; generating a pattern of grey scale levels for each defect based on the corresponding grey scale level of each defect detected at each layer of the test structure; and determining a resistive range of each defect by comparing the pattern of grey scale levels generated for each defect to a predetermined master table.

According to yet another aspect of the invention, a test structure for determining resistances of defective resistive opens and shorts, comprising: a contact layer having one or more elements under test; a first metal layer coupled to the contact layer, the first metal layer being configured to add capacitance to the test structure; and a second metal layer coupled to the first metal layer, the second metal layer being configured to add additional capacitance to the test structure; wherein capacitance is added to each metal layer of the test structure to amplify defects that exist in the test structure and differentiate defects by their resistive value.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 6 illustrates an exemplary pattern of grey scale levels for a candidate defect detected from the test structure;

FIG. 7 illustrates a predetermined master table used for determining a resistive range of the candidate defect detected from the test structure.

DETAILED DESCRIPTION

Figure 1C:
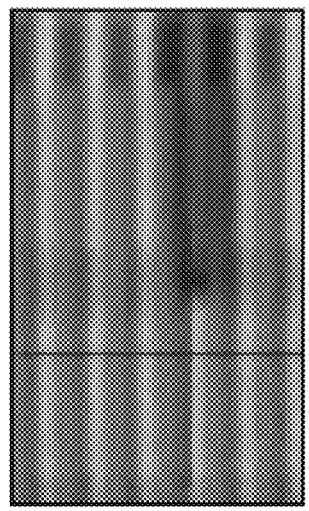
FIGS. 1A-C illustrate images of defects observed using conventional voltage contrast (VC) inspection according to one exemplary embodiment of the present invention.

Exemplary embodiments of the present invention are described in the context of exemplary multi-level/layer integrated circuit structures; including semiconductor structures and overlying metallization or other interconnects, using various levels of conductors that are separated from each other and the substrate by dielectric layers. However, structures formed using other methods of semiconductor fabrication also fall with the scope of exemplary embodiments of the present invention. Various metals or metal alloys can be used as conductors in exemplary embodiments of the invention. For example, copper, tungsten or aluminum can be used as candidates for the conductors. Silicides, such as NiSi, PtSi or their alloys would also serve as good candidates for the conductors. Candidates for dielectric materials can include silicon oxide or organosilicate glass. Of course, other dielectric materials can be used in other exemplary embodiments of the invention.

Exemplary embodiments of a system and method for determining resistances of defective resistive opens or shorts in a voltage contrast test structure in accordance with the present invention will now be described with reference to the drawings. The exemplary method described herein enables a user to quantify the resistance of defective resistive opens and shorts by adding additional capacitance to a test structure at subsequent test layers. In one exemplary embodiment, the test structure is inspected with an e-beam tool at each of its layers enabling for the generation of an e-beam image of each of its layer to graphically identify defects observed at each layer of the test structure. In one exemplary embodiment, each defect detected at each layer has a corresponding grey scale level indicative of its resistance. In one exemplary embodiment, a pattern of grey scale levels is generated for each defect based on the corresponding grey scale level of each defect detected at each layer of the structure.

A resistive range can be determined for each defect based on the pattern of grey scale levels generated for each respective defect. In accordance with one embodiment, the resistive range is determined by comparing the pattern of grey scale levels generated for each defect to a predetermined master table. The predetermined master table can include a plurality of patterns of grey scale levels each assigned to one of a plurality of predetermined resistive ranges. Obtaining an idea of the resistance value of defects can be helpful during failure analysis. For example, if the resistance is high enough, it might not cause electrical failure. A user (e.g., chip designer) can also determine the impact of high resistive leakages on yield. This information can also enable a user to focus its attention on other more troubling defects (ones with a small resistance that may cause electrical failure). Further, the resistance of the typical defect can be used as a metric when investigating different potential solutions. The ability to quantify the resistance of opens would be helpful for characterization of processes.

Figure 1B:
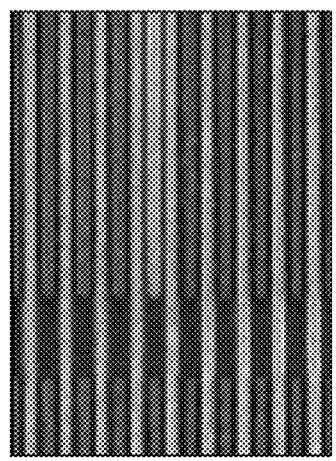
Figure 1A:
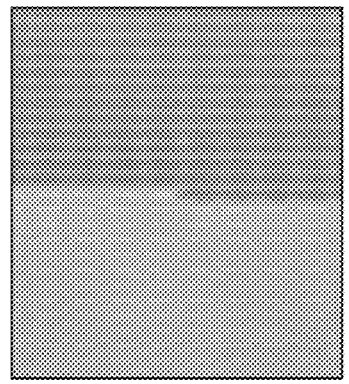
Figure 2:
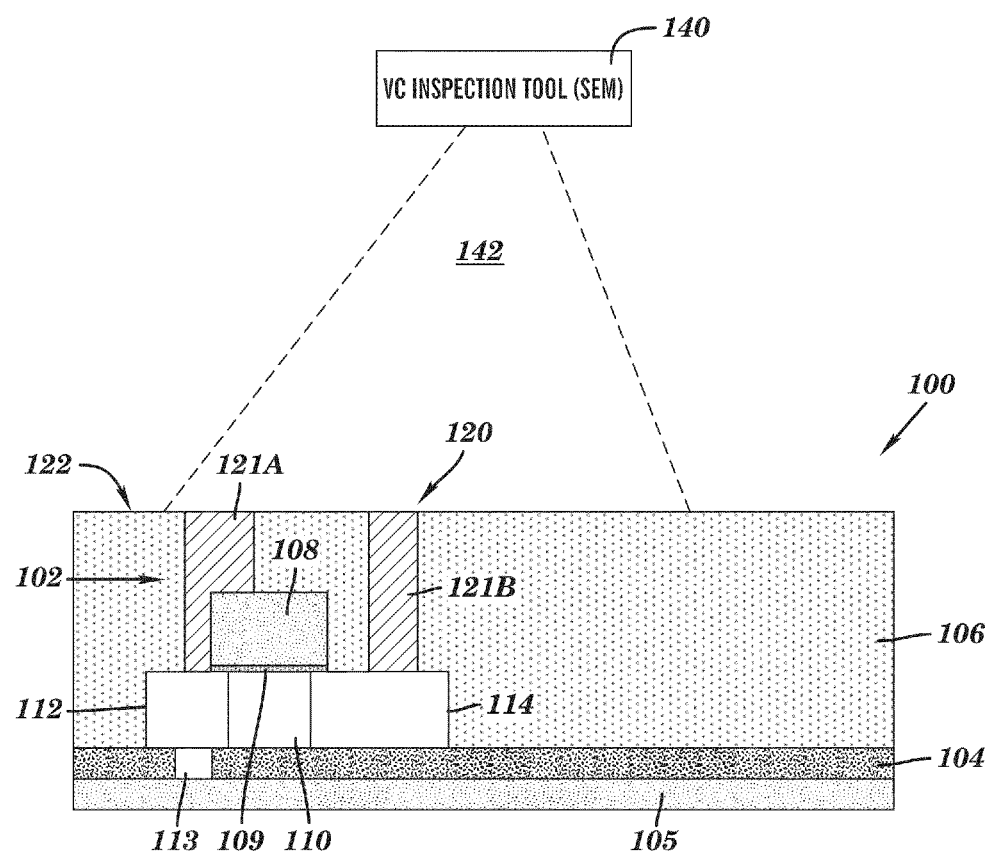
FIG. 2 illustrates an exemplary environment of voltage contrast inspection employing a test structure built up to a first layer according to one exemplary embodiment of the present invention.

Now referring to the drawings, FIG. 2 illustrates a portion of a test structure 100 in accordance with one exemplary embodiment. The test structure 100 described herein can be part of the design for an integrated circuit chip. The test structure 100 includes one or more elements under test 102 formed over buried oxide layer 104 on a bulk substrate 105 and in a dielectric layer 106 of the structure during the fabrication of an integrated circuit (IC) chip. For ease of discussion, only one element under test 102 is shown in detail in FIG. 1. The element under test 102 can be any electrical device, such as a transistor (e.g., Negative Field Effect Transistor (NFET)) that generally includes a gate electrode 108 and gate dielectric 109 over a channel region 110 in the substrate 106 with a drain region 112 grounded to the substrate 105 through a hole 113 formed through the oxide 104. In addition, a source region 114 formed in the substrate on opposite sides of the channel region. In this example, the transistor is coupled to electrical contacts 120 that serve as interconnects. The element under test 102 as described herein can also be rows of contacts 120 or a via chain (not shown). As shown in this example, one contact is used as a local interconnect 121A to ground the gate electrode 108 while another contact serves as the contact 121B to be tested.

Figure 3:
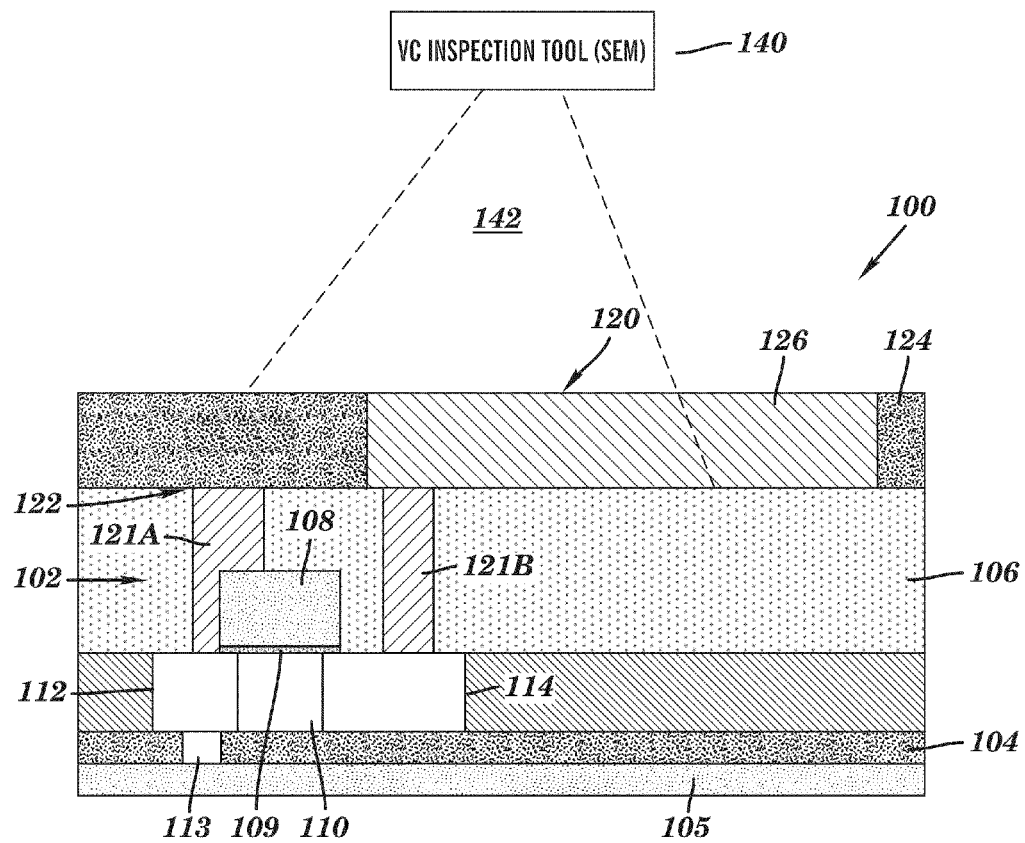
FIG. 3 illustrates an exemplary environment of voltage contrast inspection employing the test structure built up to a first metal layer to add capacitance across the test structure according to one exemplary embodiment of the present invention.
Figure 4:
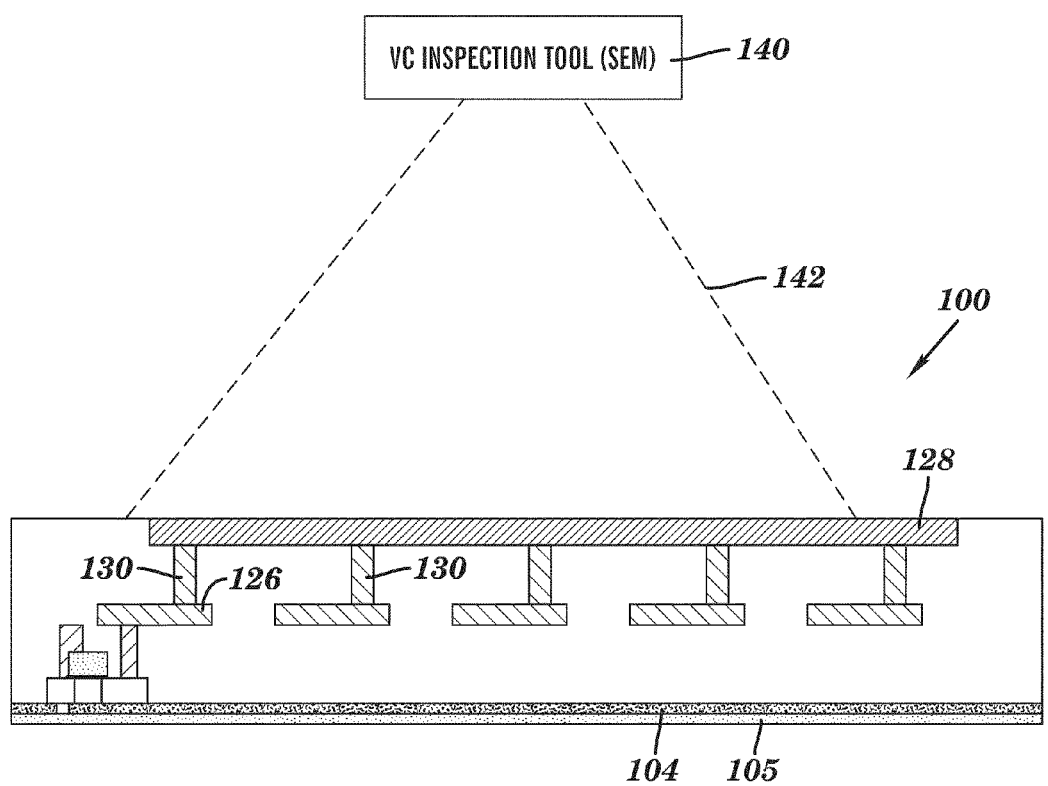
FIG. 4 illustrates an exemplary environment of voltage contrast inspection employing the test structure built up to a second metal layer to add additional capacitance to the test structure according to one exemplary embodiment of the present invention.

In accordance with one exemplary embodiment, the elements under test form a product or contact layer 122 of the test structure in which other layers or levels of the test structure are built upon. In one exemplary embodiment, the test structure is built up to a first metal layer 124 as shown in FIG. 3. In accordance with one exemplary embodiment, capacitance is added to the test structure at the first metal layer 124. Capacitance is added by coupling multiple elements under test to one another or coupling M1 capacitors to each element under test through a pattern of wires. In this example, the element under test is coupled to a capacitor 126 by an interconnect. In accordance with one exemplary embodiment, additional capacitance is added to the test structure at a second metal layer 128 as shown in FIG. 4. Interconnects 130 are used to enable additional capacitance to be added at the second metal layer 128. As such, an exponentially increasing amount of capacitance is added to the test structure with each metal level. With little capacitance, most resistive defects will appear as opens. As capacitance is added however, the lower resistive defects start looking like shorts changing the conditions of the defects. In other words, adding capacitance to the test structure as described above amplifies defective resistive opens/shorts that exist in the test structure and differentiates defects by their resistive value. The test structure can be built up to a third metal layer, a fourth metal layer, and so forth, where each subsequent metal layer serves to increase the amount of capacitance to the test structure.

In accordance with one exemplary embodiment, defects (defective resistance opens or shorts) are detected at each layer of the test structure using voltage contrast (VC) inspection. Voltage contrast inspection may use any currently known or later developed technique, e.g., using voltage contrast inspection tool 140 including a scanning electron microscope (SEM). The VC inspection tool 140 is configured to generate an electron beam 142 used to scan the surface of each layer of the test structure and detect defects at each layer of the test structure.

A voltage contrast inspection is capable of localizing defects, and capable of acquiring a high-resolution electron beam image of the defect. The voltage contrast inspection technique operates on the basis that the potential differences in the various locations (e.g., at contacts) of a layer under examination cause differences in electron emission intensities when the layer is the target of the electron beam. In other words, each contact scanned by the electron beam emits a number of electrons proportional to the voltage potential at that contact. Each e-beam image can graphically identify defects at each layer of the test structure. More specifically, each e-beam image can graphically identify defect locations in the form of a wafer map/pattern. Of course, e-beam images can also identify non-defects and their locations.

In accordance with one exemplary embodiment, each defect is graphically depicted with a corresponding grey scale level indicative of its resistance. The corresponding grey scale level of each defect can be anywhere between, for example, 1-100, where a contact appears darker at grey scale levels closer to 1 and a contact appears brighter at grey scale levels closer to 100 in accordance with one exemplary embodiment. Of course, the scale can be of any range with different levels of granularity and should not be limited to the example described herein. Further, the system may be configured such that a high potential contact is displayed as bright and a low potential contact is displayed as bright. However, in this example, a contact that appears dark suggests a high potential while contacts that appear bright suggests a low potential.

Figure 5B:
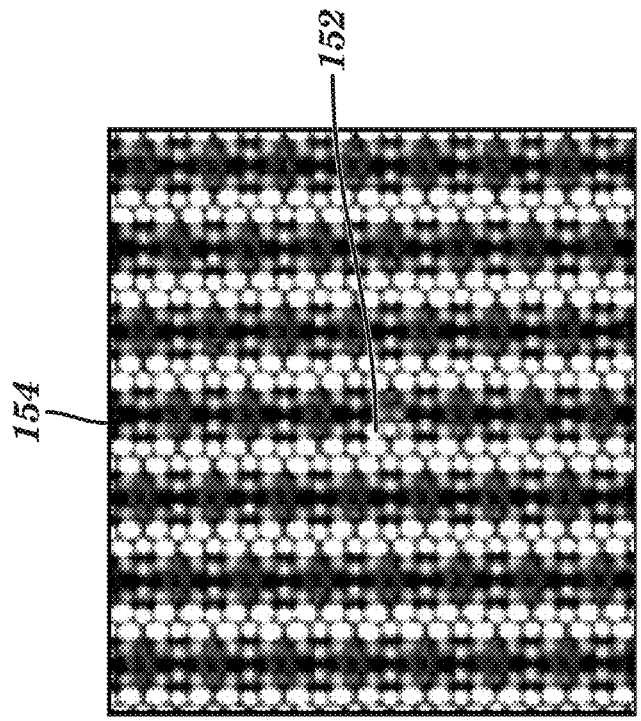
FIGS. 5A-5B illustrate exemplary e-beam images that graphically identify defects of a layer of the test structure under examination.
Figure 5A:
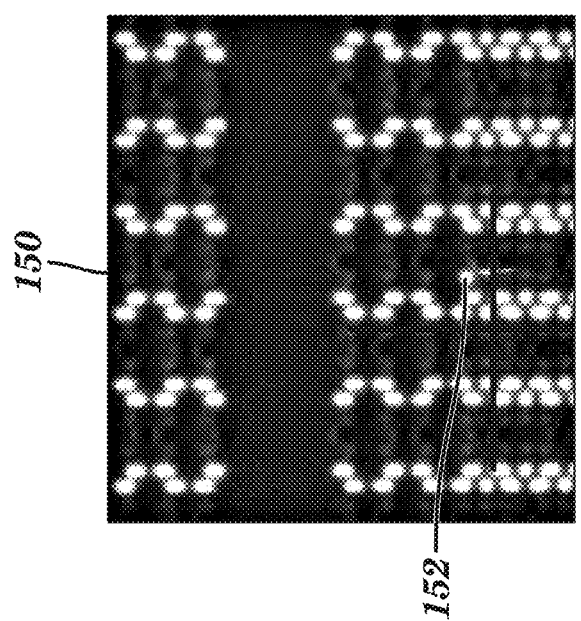

FIG. 5A illustrates an exemplary e-beam image 150 generated for one of the layers. As shown, a pattern of contacts with corresponding grey scale levels are depicted. In this e-beam image 150, the one contact that appears bright clearly from the pattern should be dark because it is outside the pattern, thus is a defect. This one contact is indicated by arrow 152. Once this defect at one layer (e.g., contact layer) of the structure is recorded along with its corresponding grey scale level, the same defect scanned at another layer (e.g., first metal layer) of the structure is also recorded along with its corresponding grey scale level as depicted in exemplary e-beam image 154 in FIG. 5B. Therefore, by scanning the same structure multiple times at different layers of the structure, the resistance of each defect may be localized within a certain range.

In operation, voltage contrast inspection is performed for each layer of the test structure to generate a corresponding e-beam image of each layer. For example, contact layer 106 is scanned to generate a first e-beam image that graphically identifies defects detected at the contact layer 106 as shown in FIG. 2. Then, the first metal layer 124, which provides added capacitance to the structure, is scanned to generate a second e-beam image that graphically identifies defects at the first metal layer 124 as shown in FIG. 3. Additional layers of the structure are scanned to generate corresponding e-beam images of those layers. Once each layer is scanned and the defects with their corresponding grey scale level are recorded, a pattern of grey scale levels for each defect is generated in accordance with one exemplary embodiment. The pattern of grey scale levels of each defect is based on the corresponding grey scale level of each defect detected at each layer of the test structure. FIG. 6 illustrates an exemplary pattern of grey scale levels 160 of a candidate defect. As shown, the corresponding grey scale level of the defect at each layer of the structure is recorded forming pattern 160. In this example, the corresponding grey scale level of the candidate defect at the contact layer, the first metal layer, the second metal layer, the third metal layer and the fourth metal layer is recorded to generate the pattern 160. The defects detected with each scan are associated based on their location on the wafer (i.e., the same physical defect will be detected at multiple levels). The pattern of grey scale levels for each defect is compared to a predetermined master table to determine a resistance range of each defect. An exemplary predetermined master table 162 is shown in FIG. 7.

In accordance with one exemplary embodiment, the predetermined master table 162 includes a plurality of patterns of grey scale levels each assigned to one of a plurality of predetermined resistive ranges. In this example, the pattern 160 for the candidate defect matches the pattern of grey scale levels having a resistive range of 10-50 Mohm. Of course, the resistive ranges can vary depending on application and can be more granular. In other words, the range of resistance values for each pattern can be smaller further providing a more accurate resistance reading of each defect.

In accordance with one exemplary embodiment, the predetermined master table can be formed by modeling a test structure with predetermined values. For example, an accurate model of a test structure with known resistances and capacitance can be represented by Equation (1):

$$V_{out}(t)=IR(1-\exp(-t/RC)) \qquad \text{(equation 1)}$$

In this equation, Vout represents the output voltage of the element under test. Vout is a function of time (t), resistance (R), the induced current (I), and the total capacitance (C) added to the structure. This function reaches a maximum value of IR. This is a steady state value. In most cases, the induced voltage is limited by other factors, including the build-up of an electric field which reduces I and is believed to saturate between 2 and 3 volts. Therefore, a more accurate model is represented by Equation (2) where the product RC is the time constant of the equation.

$$V_{out}(t)=\min[3,IR(1-\exp(-t/RC)] \qquad \text{(equation 2)}$$

In accordance with one exemplary embodiment, the system described herein includes a central processing unit (CPU) (not shown), which can be an integral part of the VC inspection tool 140 or a separate unit, configured to generate the e-beam images as described above. The CPU is also configured to record the corresponding grey scale level of each defect at each layer of the structure and generate a pattern of grey scale levels for each defect. The CPU is further configured to determine a resistive range of each defect by comparing the pattern of grey scale levels generated for each defect to the predetermined master table.

The CPU can be any conventional processing unit configured for carrying out the methods and/or functions described herein. In one exemplary embodiment, the CPU comprises a combination of hardware and/or software/firmware with a computer program that, when loaded and implemented, permits the CPU to operate such that it carries out the methods described herein.

Figure 8:
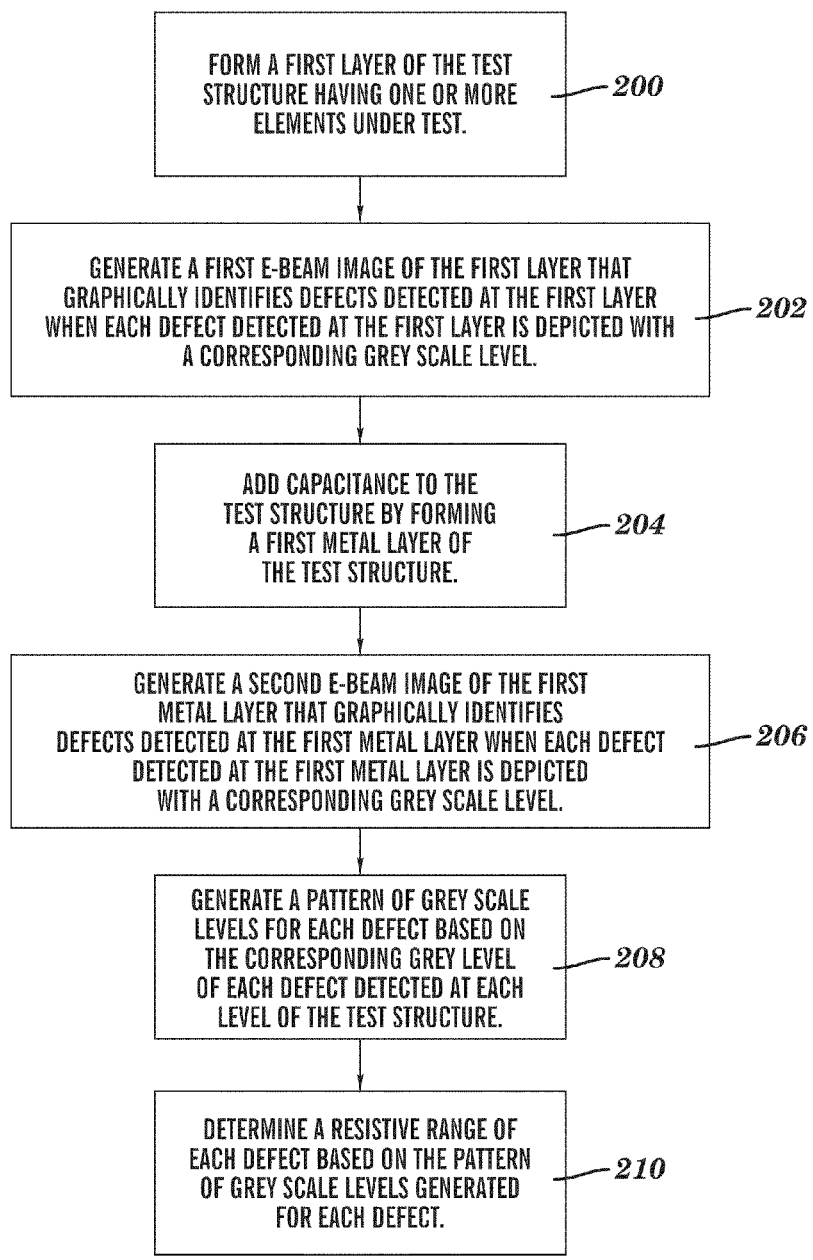
FIG. 8 is a flow diagram that provides a method for determining resistances of defective opens or shorts in a test structure.

Now referring to FIG. 8 a method for determining resistances of defective resistive opens or shorts in a test structure in accordance with one exemplary embodiment will now be discussed.

At block 200, form a first layer of the test structure having one or more elements under test. The one or more elements under test can include at least one contact, via chain, transistor or a combination thereof in accordance with one exemplary embodiment. The first layer of the test structure can be formed in a manner as described above and shown in FIG. 2.

At block 202, generate a first e-beam image of the first layer that graphically identifies defects detected at the first layer where each defect detected at the first layer is depicted with a corresponding grey scale level. The first e-beam image is generated by scanning the surface of the first layer (e.g., contact layer) with an electron beam as described above.

At block 204, add capacitance to the test structure by forming a first metal layer of the test structure. Capacitance is added by coupling multiple elements under test to one another or coupling M1 capacitors to each element under test through a pattern of wires as described above. The added capacitance amplifies defective resistive opens/shorts that exist in the test structure.

At block 206, generate a second e-beam image of the first metal layer that graphically identifies defects detected at the first metal layer where each defect detected at the first metal layer is depicted with a corresponding grey scale level. The second e-beam image is generated by scanning the surface of the first metal layer with another electron beam as described above.

At block 208, generate a pattern of grey scale levels for each defect based on the corresponding grey scale level of each defect detected at each layer of the test structure. The defects detected with each scan are associated based on their location on the wafer (i.e., the same physical defect will be detected at multiple levels). That same defect being detected at multiple levels enable the generation of the pattern of grey scale levels for that particular defect as described above.

At block 210, determine a resistive range of each defect based on the pattern of grey scale levels generated for each defect. The resistive range is determined by comparing the pattern of grey scale levels generated for each defect to a predetermined master table as described above.

In accordance with one exemplary embodiment, additional metal levels are formed where capacitance is added at subsequent metal levels. Capacitance is added to differentiate defects by their resistive value. The methods described herein would enable a user to determine the magnitude of resistance of an open having resistance but is not necessarily a hard failure (e.g., less than 100 ohms).

The ability to quantify the resistance of opens represents a key tool in assessing the position and extent of defects within semiconductor structures without the need to delayer or section the semiconductor wafer. This ability would be useful in the detection of defects induced by certain semiconductor fabrication steps early in the manufacturing process.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for determining resistances of defective resistive opens or shorts in a test structure, comprising:
    forming a first layer of the test structure having one or more elements under test;
    generating a first e-beam image of the first layer, the first e-beam image graphically identifying defects detected at the first layer, each defect detected at the first layer having a corresponding grey scale level;
    adding capacitance to the test structure by forming a first metal layer of the test structure;
    generating a second e-beam image of the first metal layer, the second e-beam image graphically identifying defects detected at the first metal layer, each defect detected at the first metal layer having a corresponding grey scale level;
    generating a pattern of grey scale levels for each defect based on the corresponding grey scale level of each defect detected at each layer of the test structure; and
    determining a resistive range of each defect based on the pattern of grey scale levels generated for each defect.

2. The method of claim 1, wherein the resistive range is determined by comparing the pattern of grey scale levels generated for each defect to a predetermined master table.

3. The method of claim 2, wherein the predetermined master table includes a plurality of patterns of grey scale levels, each of the plurality of patterns of grey scale levels is assigned to one of a plurality of predetermined resistive ranges.

4. The method of claim 1, wherein the first e-beam image and the second e-beam image are generated by performing a first voltage contrast inspection over the first layer and a second voltage contrast inspection over the first metal layer respectively.

5. The method of claim 4, wherein an electron beam is utilized for the first voltage contrast inspection and the second voltage contrast inspection.

6. The method of claim 1, further comprising:
    adding additional capacitance to the test structure by forming a second metal layer of the test structure; and
    generating a third e-beam image of the second metal layer, the third e-beam image graphically identifying defects detected at the second metal layer, each defect detected at the second metal layer having a corresponding grey scale level.

7. The method of claim 1, wherein adding capacitance to the test structure amplifies defects that exist in the test structure and differentiates defects by their resistive value.

8. The method of claim 1, wherein the one or more elements under test comprise of at least one electrical contact or at least one contact chain.

9. The method of claim 1, wherein the one or more elements under test comprise of at least one electrical device.

10. The method of claim 1, wherein adding capacitance to the test structure includes coupling at least one of the one or more elements under test to another one of the one or more elements under test or to at least one capacitor.

11. The method of claim 1, wherein the corresponding grey scale level of each defect is indicative of its resistance.

12. A method for determining resistances of defective resistive opens or shorts in a test structure, comprising:

forming a first layer of the test structure having one or more elements under test;

generating a first e-beam image of the first layer, the first e-beam image graphically identifying defects detected at the first layer, each defect detected at the first layer having a corresponding grey scale level;

adding capacitance to the test structure by forming a first metal layer of the test structure;

generating a second e-beam image of the first metal layer, the second e-beam image graphically identifying defects detected at the first metal layer, each defect detected at the first metal layer having a corresponding grey scale level;

generating a pattern of grey scale levels for each defect based on the corresponding grey scale level of each defect detected at each layer of the test structure; and determining a resistive range of each defect by comparing the pattern of grey scale levels generated for each defect to a predetermined master table.

13. The method of claim 12, wherein the predetermined master table includes a plurality of patterns of grey scale levels, each of the plurality of patterns of grey scale levels is assigned to one of a plurality of predetermined resistive ranges.

14. The method of claim 12, wherein adding capacitance to the test structure includes coupling at least one of the one or more elements under test to another one of the one or more elements under test or to at least one capacitor.

15. The method of claim 12, wherein the corresponding grey scale level of each defect is indicative of its resistance.

16. The method of claim 12, wherein the first e-beam image and the second e-beam image are generated by performing a first voltage contrast inspection over the first layer and a second voltage contrast inspection over the first metal layer respectively.

* * * * *